United States Patent [19]

Ogura et al.

[11] Patent Number: 4,659,947

[45] Date of Patent: Apr. 21, 1987

[54] PLA WITH FORWARD-CONDUCTION BIPOLAR "AND" ARRAY AND I²L "OR" ARRAY

[75] Inventors: Setsuo Ogura; Shizuo Kondo; Eiji Minamimura, all of Takasaki; Makoto Furihata, Tamamura, all of Japan

[73] Assignee: Hitachi, Ltd., Tokyo, Japan

[21] Appl. No.: 665,385

[22] Filed: Oct. 26, 1984

[30] Foreign Application Priority Data

Oct. 26, 1983 [JP] Japan .................. 58-199020

[51] Int. Cl.⁴ .......................... H03K 19/082
[52] U.S. Cl. .................... 307/466; 307/446; 307/459; 364/716
[58] Field of Search .............. 307/458–459, 307/465–467, 477, 317 A, 446; 364/716

[56] References Cited

U.S. PATENT DOCUMENTS

| | | | |
|---|---|---|---|
| 4,129,790 | 12/1978 | Gani et al. | 307/458 X |
| 4,207,556 | 6/1980 | Sugiyama et al. | 307/467 X |
| 4,229,803 | 10/1980 | Rhodes | 364/716 X |
| 4,311,926 | 1/1982 | Patel et al. | 307/466 |
| 4,514,650 | 4/1985 | Yum | 307/466 |
| 4,554,640 | 11/1985 | Wong et al. | 307/465 X |

OTHER PUBLICATIONS

Allard et al, "Variable Multifold Programmable Logic Array", IBM T.D.B., vol. 24, No. 6, 11-1981, pp. 2971-2973.

Askin et al, "PLA with Intermixed AND and OR Arrays", IBM T.D.B., vol. 24, No. 8, Jan. 1982, pp. 4291-4292.

Primary Examiner—Stanley D. Miller
Assistant Examiner—D. R. Hudspeth
Attorney, Agent, or Firm—Antonelli, Terry & Wands

[57] ABSTRACT

An integrated programmable logic array formed within a single silicon chip comprises a combination of an NAND or AND gate array and an NOR or OR gate array.

The NAND or AND gate array includes a plurality of bipolar transistors which are driven to operate in the forward direction by a plurality of input signals, and a plurality of Schottky barrier diodes provided between the collectors of the bipolar transistors and output signal lines. The NOR or OR gate array includes a plurality of other bipolar transistors which are driven to operate in the backward direction by a plurality of output signals from the NAND or AND gate array.

10 Claims, 7 Drawing Figures

PLA WITH FORWARD-CONDUCTION BIPOLAR "AND" ARRAY AND I²L "OR" ARRAY

BACKGROUND OF THE INVENTION

This invention relates to a technique applied to semiconductor integrated circuits, and which is particularly effective when applied to a bipolar type of semiconductor integrated circuit. The technique of the invention can be applied effectively to, for example, a PLA (Programmable Logic Array) consisting of a NAND (or AND) gate array and a NOR (or OR) gate array.

The inventors of the present invention have clarified that the following problems are encountered when fabricating logic circuits by semiconductor integrated circuit techniques such as PLA circuit techniques.

An outline of a PLA as a logic circuit will first be given briefly. A PLA consists of a NAND or AND gate array and a NOR or OR gate array. The NAND or AND gate array first executes a NAND or AND operation for a plurality of logic inputs applied thereto from outside. Next, the NOR or OR gate array executes a NOR or OR operation for a plurality of logical output signals produced from the NAND or AND gate array. A logical output satisfying predetermined logic conditions is thus obtained from the NOR or OR gate array. In this case, the logic conditions can be set as required in advance by the wiring of the internal circuits of each of the NAND or AND and NOR or OR gate arrays. In other words, the logic conditions can be programmed.

A NAND or AND gate array usually consists of a large number of logic elements arranged in a regular order, and a wiring network provided between the electrodes of these logic elements.

In a PLA of this kind, an extremely large number of logical elements are used, particularly in the NAND or AND gate array, and the number of the lements increases rapidly with increasing circuit size. If a PLA is assembled using a bipolar semiconductor integrated circuit, therefore, an extremely large number of bipolar elements must be formed as the logic elements.

In this case, the number of elements can be reduced if IIL (Integrated Injection Logic) devices with a multi-electrode structure are used as the logic elements. However, since the structure of an IIL device is opposite to that of an ordinary bipolar transistor, it must be operated with a current gain in the reverse direction, that is, with an inverse current gain $\beta_i$. This inverse current gain $\beta_i$ is much lower than the forward current gain $\beta$ of an ordinary bipolar transistor, so that the driving effect thereof, the so-called "drivability", is extremely low. This results in the problem that the number of electrodes that can be formed for one IIL device is limited. For this reason, an extremely large number of elements are still necessary when assembling a large-scale logic circuit using ILL devices. In order to actuate an IIL device, a constant current called an "injection current" must always flow, and this results in an increase in the current consumption. Since a large number of elements are used, this current consumption is even greater, the layout structure is more complicated, and a larger area is required. These are problems in the prior art that have been discovered by the inventors of the present invention.

"Electronics", p.p. 86-89, published on July 10, 1975 proposes a Schottky-IIL technique which reduces logic swings and improves the operating speed by the use of a large number of Schottky diodes for the output of an IIL device. Schottky diodes are formed by bringing a large number of electrodes into contact with the surface of an $n^-$-type epitaxial layer. This article in "Electronics" also proposes an IIL-like complementary constant-current logic circuit in which a large number of Schottky diodes are used for the output of the circuit, and pnp current-source transistors and complementary npn switching transistors are formed within the same small isolation region.

The present invention is directed to eliminating the problems relating to the application of IIL devices to the PLA described above, and further develop the Schottky circuit technique described above.

SUMMARY OF THE INVENTION

It is therefore an object of the present invention to provide a semiconductor integrated circuit technique which can be used to fabricate a logic circuit which has a lower current consumption in a bipolar semiconductor integrated circuit.

Another object of the present invention is to provide a high-density semiconductor integrated circuit technique which is suitable for the fabrication of large-scale logic circuits.

A further object of the present invention is to provide a semiconductor integrated circuit technique which can be used to fabricate a logic cirucit which has a high operating speed.

These and other objects and novel features of the present invention will become more apparent from the following description taken in conjunction with the accompanying drawings.

Of the inventions disclosed herein, the following is a brief description of a typical example thereof.

Logic elements forming part or all of a logic circuit in a bipolar semiconductor integrated circuit are constructed to have a forward device structure. The forward devices are composed, in turn, of bipolar transistors with a plurality of Schottky diodes formed in the collector regions thereof. This arrangement can achieve the objects of the present invention, that is, reduce the number of elements needed in a logic circuit, improve the regularity of the structure layout, reduce the current consumption, and enable the fabrication of a large-scale logic circuit within a relatively limited area.

DESCRIPTION OF THE PREFERRED EMBODIMENTS

Figure 1:
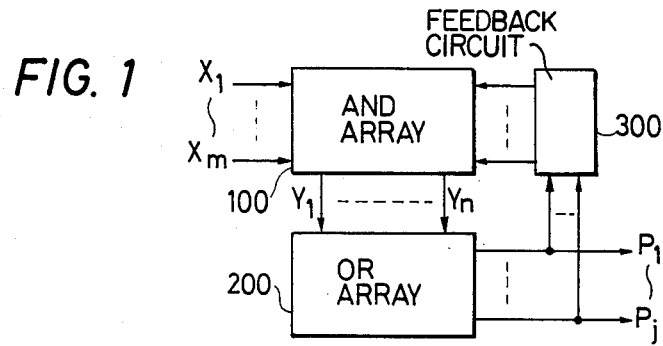
FIG. 1 is a block diagram of an outline of a PLA, given as an example of the application of the semiconductor integrated circuit in accordance with the present invention.

Hereinafter, typical embodiments of the present invention will be described with reference to the accompanying drawings.

The same reference numerals are used to identify identical or similar constituents throughout the drawings.

FIG. 1 illustrates the outline of a logic circuit which is formed as an internal circuit of a semiconductor integrated circuit in accordance with the present invention.

The logic circuit shown in the drawing is formed as a PLA which consists of a NAND or AND gate array 100, a NOR or OR gate array 200, and a feedback circuit 300 which is also provided if necessary.

The outline of the logic circuit is as follows. First of all, the NAND or AND gate array 100 executes NAND or AND operations on a plurality of logical input signals $X_1$-$X_m$ applied thereto from outside, the NOR or OR gate array 200 then executes NOR or OR operations on a plurality of logical ouptut signals $Y_1$-$Y_m$ applied thereto from the NAND or AND gate array 100. Logical outputs $P_1$-$P_j$ satisfying predetermined logic conditions can thus be obtained from the NOR or OR gate array 200. These conditions can be set as desired in advance by the wiring conditions of the internal circuits of each of the NAND or AND and the NOR or OR gate arrays 100 and 200. In other words, the logic conditions can be programmed.

The feedback circuit 300 can be provided, if desired, to feed back part of the logical outputs $P_1$-$P_j$ to the NAND or AND gate array 100 (see "Integrated Circuits Application Handbook", Asakura Book Co., June 30, 1981, pp. 45–46 and 293–301). It is thus possible thorugh the use of the feedback circuit 300 to provide a holding operation such as shifting in the logic conditions on the basis of a specific logic state. The feedback circuit 300 can be formed by a delay circuit made up, for example, of delay-type flip-flops or registors to provide the holding operation.

Figure 2:
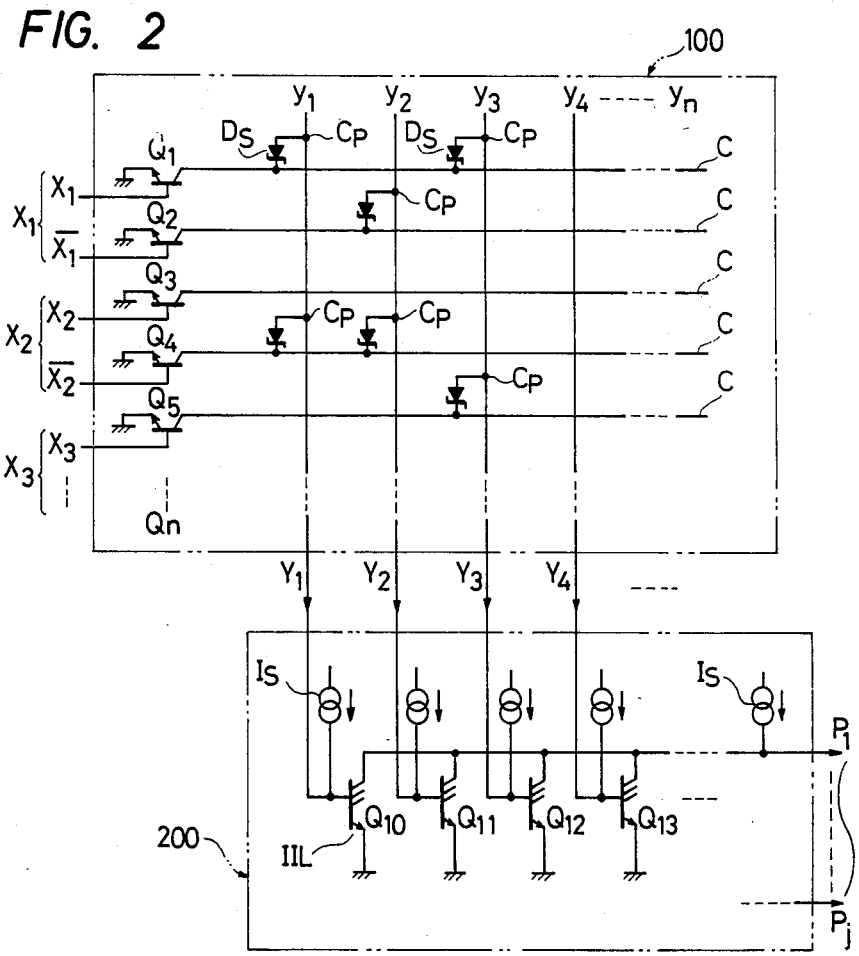
FIG. 2 is a circuit diagram of the NAND and NOR gate array portions of the PLA of FIG. 1 in accordance with the present invention.

FIG. 2 shows part of the internal circuit of the PLA described above, which internal circuit consists of the NAND gate array 100 and the NOR gate array 200.

Although the feedback circuit 300 could be provided between the input of the NAND array 100 and the output of the NOR gate array 200, it is omitted from the drawing of FIG. 2 for purposes of simplicity.

The NAND gate array consists of a large number of npn bipolar transistors $Q_1$, $Q_2$, $Q_3$, $Q_4$, $Q_5$ ... acting as logic elements.

Figure 3:
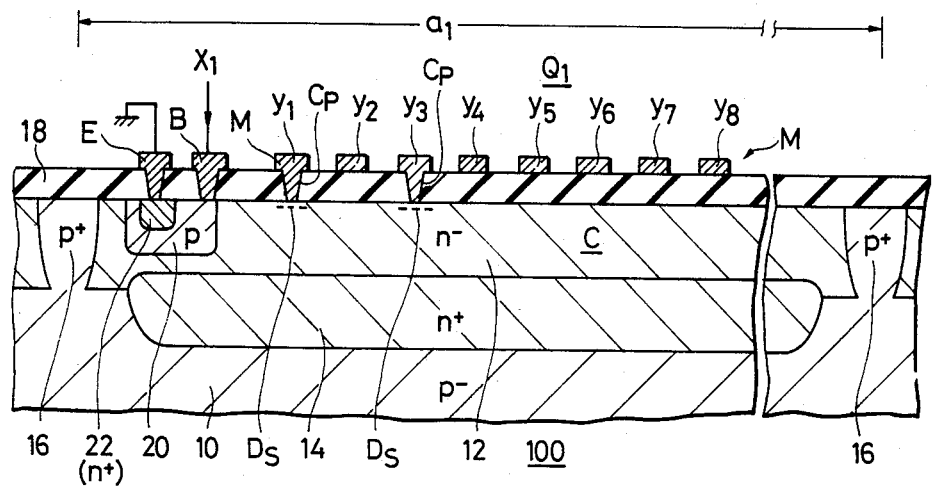
FIG. 3 is a section through an example of a bipolar transistor of a multi-electrode structure, which is used as the logic element in the PLA of FIG. 2.

Only one ($Q_1$) of the npn bipolar transistors $Q_1$, $Q_2$ ... is shown as an example in FIG. 3, but each has a forward device structure and is connected to metal wiring $Y_1$ and $Y_3$ in a collector region C thereof by a diode Ds which is a Schottky barrier diode. This Schottky barrier diode prevents any backflow of current, and also prevents any mutual interference due to the logical processing executed in the PLA.

The structure of the bipolar transistor $Q_1$ of FIG. 3 will now be described through steps in its fabrication.

A $p^-$-type silicon semiconductor substrate 10 on which an $n^-$-type silicon epitaxial layer 12 is formed is used as a piece of semiconductor starting material A p-type impurity is doped to a low concentration into the $p^-$-type silicon semiconductor substrate 10, while an n-type impurity is doped to a low concentration into the $n^-$-type silicon epitaxial layer 12. An n-type impurity is diffused to a high concentration into the base of the epitaxial layer 12, to form an $n^+$-type buried layer 14.

A $p^+$-type isolation layer 16 which reaches into the interior of the semiconductor substrate from the epitaxial layer 12 is then formed. This isolation layer 16 is formed by selectively diffusing a p-type impurity to a high concentration. An electrically isolated device-formation region al is defined by this isolation layer 16.

A p-type region 20 (base region) is formed in this device-formation region al by the selective diffusion of a p-type impurity to a medium concentration, and an $n^+$-type region 22 (emitter region) is then formed within this p-type region 20 by the selective diffusion of an n-type impurity to a high concentration.

Thereafter, part of an oxidized insulation film 18 formed over the surface of the substrate is selectively removed. After a wiring material such as aluminum is deposited by sputtering or the like, selective etching and a heat-treatment (sintering) are then effected for form wiring y1, y2, y3, y4, y5, y6, y7, y8 ... In this case, a Schottky barrier diode is formed by this heat-treatment at the contact portion between the wiring Y and the epitaxial alyer 12, that is, in the collector region C.

The npn bipolar transistor $Q_1$ of a multi-electrode structure is formed in this manner.

The other bipolar transistors $Q_2$, $Q_3$, $Q_4$ ... etc. are formed similarly.

A base electrode B is led out from the p-type region 20, and an emitter electrode E from the $n^+$-type region 22. The wiring y1, y2, y3 ... extends over the collector regions on the oxidized insulating film 18 in the direction perpendicular to the plane of the drawing. Wires y1, y3 that are arbitrarily selected are connected to the collector regions through contact points CP which are through holes.

Figure 4:
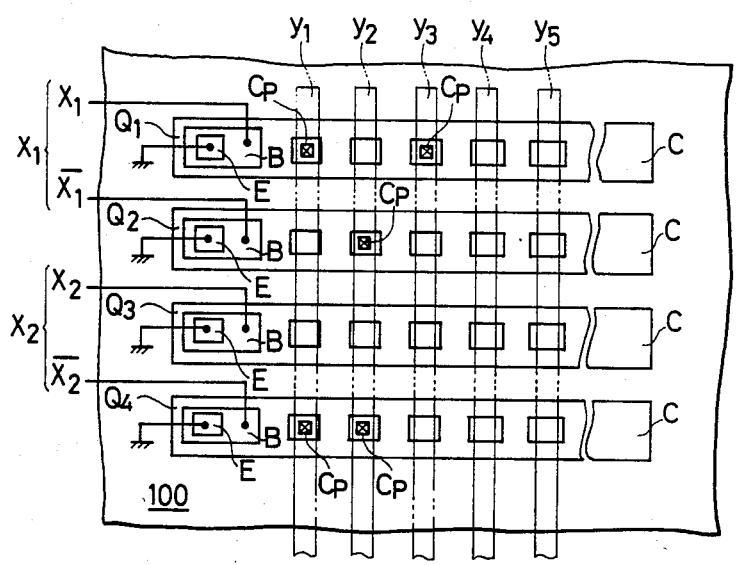
FIG. 4 is a plan view of the layout of one part of the semiconductor integrated circuit in which the NAND gate array is formed.

The wiring y1, y2, y3 ... is arranged so as to pass over the collector regions of a large number of bipolar transistors $Q_1$, $Q_2$, $Q_3$ ... that are aligned in the same direction, as shown in FIG. 4. Each wire is connected to each IIL device of the NOR gate array 200 as the logical outputs Y1, Y2, Y3 ... of the NAND gate array 100, as will be described later.

Referring back to FIG. 2, the NOR gate array 200 is shown composed of a large number of IIL devices of a multi-electrode structure acting as bipolar elements. Each of the logical outputs Y1, Y2, Y3 ... from the NAND gate array 100 is applied to one of the bases of these IIL devices. Wired OR circuits comprising any combination of devices are formed on the collector side of these multi-electrode structure IIL devices, that is, on the multicollector side thereof, to provide NOR operations.

The base of each IIL device in the NOR gate array 200 is pulled up to "H" logic level by a constant-current circuit Is. The multicollector side of each IIL is formed as a so-called "open collector" in order to provide the wired ORs. On the other hand, if desired, a constant-current circuit $I_S$ for this pull-up can be provided for each logical output of the NOR gate 200, as shown at the far right of circuit 200 in FIG. 2.

In this NAND gate array 100, a plurality of logical inputs X1, X2, X3 ... are divided into non-inverted signals and inverted signals. The logical inputs X1, $\overline{X1}$, X2, $\overline{X2}$, X3, $\overline{X3}$, thus divided into non-inverted signals and inverted signals are applied to the bases B of the multi-electrode structure, bipolar transistors 1, Q2, Q3, Q4, Q5 . . . , respectively.

The emitter E of each bipolar transistor Q1, Q2, Q3, Q4, Q5 . . . is connected to "L" logic level, that is, to ground potential.

The wiring y1, y2, y3, y4 extend over the collector regions of the bipolar transistors Q1, Q2, Q3, Q4, Q5 . . . Each wire y1, y2, y3, y4 . . . is pulled up to "H" logic level by the corresponding constant-current circuit Is connected to the base of each III device.

A contact (CP) between the collector region ($N^-$-type epitaxial layer 12) of the collector region of each transistor Q1, Q2, Q3 . . . and each wire y1, y2, y3 . . . is selected in accordance with logic conditions that are set as required. In other words, a wired AND circuit is constituted in accordance with how the collectors of these transistors are connected to the wiring y1, y2, y3 . . .

Returning to FIG. 2, the collectors of the transistors Q1 and Q4 are shown connected to the wire y1. Accordingly, the logical output Y1 generated at this wiring y1 reaches "H" level when both transistors Q1 and Q4 are turned off (nonconductive). In other words, when the base inputs X1 and $\overline{X2}$ of both transistors Q1 and Q4 are "L", or when the logic condition $\overline{X1} \cdot X2 = 1$ is statisfied, Y1 is "H" level; and when this logic condition is not satisfied, it is at "L" level. In this manner, a logical output $\overline{X1} \cdot X2$ is generated at the logical output Y1 of the NAND gate array 100, and is applied to the base of the corresponding IIL device of the OR gate array 200.

The collectors of each of the transistors Q2 and Q4 are connected to the wire y2 by the contact points CP, so that the logical output Y2 generated in the wire y2 in this case reaches "H" logic level when both transistors Q2 and Q4 are turned off (nonconductive). In other words, Y2 is at "H" level when the base inputs $\overline{X1}$, $\overline{X2}$ of the transistors Q2 and Q4 are at "L" level, that is, when the logic condition $X1 \cdot X2 = 1$ is satisfied; and is at "L" level at all other times. In this manner, the logical ouptut $X1 \cdot X2$ is generated at the logical output of the NAND gate array 100 and is applied to the base of the corresponding IIL device of the NOR gate array 200.

Similarly, the collectors of the transistors Q1 and Q5 are each connected to the wire y3 through the contact points CP. The logical output Y3 generated in the wire y3 in this case is at "H" level when both transistors Q1 and Q5 are turned off (nonconductive). In other words, Y3 is at "H" logic level when both base inputs X1 and X3 to the transistors Q1 and Q5 are at "L" level, that is, when the logic condition $\overline{X1} \cdot \overline{X3} = 1$ is satisfied; and is at "L" level at all other times. In this manner, the logical output $\overline{X1} \cdot \overline{X3}$ is generated at the logical output Y3 of the NAND gate array 100, and is applied to the base of the corresponding IIL device of the OR gate array 200.

As described above, any desired logic condition, in particular a logical product condition in this case, can be programmed for each wire y1, y2, y3 . . . by selecting and setting in advance the contact points between collector regions lead out through the series circuit of the Schottky barrier diodes Ds and the wiring.

The logical outputs Y1, Y2, Y3 . . . of the NAND gate array 100 are subjected to NOR operations by the NOR gate array 200 in the same manner as described above, and the logical outputs P1 through Pj as a result of both the NAND and NOR operations are produced.

Although any desired logic circuit can be formed as described above, it is noteworthy that the bipolar transistors Q1, Q2, Q3 . . . that have a multi-electrode structure and are used in the NAND gate array 100 have a forward device structure, as shown in FIG. 3. In other words, they operate in the forward direction. Accordingly, these bipolar transistors Q1, Q2, Q3 . . . can operate with a high forward current gain $\beta$, so that their driving effect, or so-called "drivability", is extremely high, and the load on the driving side can be greatly reduced. In addition, a single bipolar transistor can have a multicollector structure. As shown in FIGS. 2 through 4, therefore, the number of logic elements formed in the independent region al can be the number of logical inputs X1, $\overline{X1}$, X2, $\overline{X2}$, X3 . . . , so that the number of elements can be greatly reduced. This results in the advantage that the overall current consumption can also be reduced, and a large-scale logic circuit can be assembled within a relatively limited area. In the circuit shown in FIG. 2, for example, a single constant-current circuit Is for pull-up is provided for each wire y1, y2, y3 . . . , to produce the predetermined logical operation. This small number of constant-current circuits Is need not be provided individually on the NAND gate 100 side, since the same object can be achieved by Is circuits which pull up the base inputs of the IIL devices on the NOR gate 200 side. In other words, the current utilization ratio is extremely high, so that a large reduction in current consumption can be accomplished.

It is particularly noteworthy that, as shown specifically in FIG. 4, the NAND gate array 100 has a construction such that a large number of bipolar transistors Q1, Q2, Q3 . . . used therefor have the same structure and are arranged regularly in the same direction, and moreover, the wiring y1, y2, y3 . . . is regularly provided over the bipolar transistors thus arranged regularly, to achieve an extremely high degree of regularity. Since the regularity is so high, the overall construction can be simplified. This is particularly advantageous when constituting an especially large-scale logic circuit. In addition to this high degree of regularity, the bipolar transistors Q1, Q2, Q3 . . . exhibit a large driving effect because of their forward device structure, so that the size of the circuit can be further increased easily by increasing the number of multicollectors for each transistor Q1, Q2, Q3 . . .

The programming of the logical functions of the NAND gate array can be determined by whether or not contact holes are bored in the oxidized film formed on the $n^-$-type epitaxial layer, that is, whether or not the wires y1 through yn are connected to the collector regions C. Accordingly, any desired logic condition can be easily and freely obtained, simply by changing the mask in the contact-forming process.

The Schottky barrier diodes Ds preventing the backflow of the current, that are inserted in series between the collector regions of the transistors Q1 through Qn and the wires y1 through yn, respectively, can be formed by connecting the wires y1 through yn to the collector regions by contact holes, and then effecting a short heat-treatment (sintering), without making the fabrication process particularly complicated.

Figure 5:
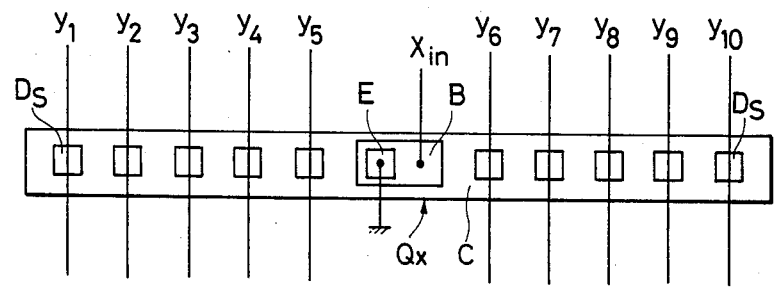
FIG. 5 is a plan view of the layout of another example of a bipolar transistor of a multi-electrode structure.

FIG. 5 illustrates another embodiment of a bipolar transistor of a multi-electrode structure.

Because of the forward device structure, a considerably large number of collector electrodes can be led out from this bipolar transistor with its multielectrode structure. If the base and emitter regions B and E are formed at the center of the device-formation region and a large number of wires y1 thorugh y10 are arranged on either side of the base and emitter regions, as shown by the bipolar transistor Qx in FIG. 5, however, the distances between the outermost wires y1, y10 and the innermost wires y5, y6 can be reduced, so that the length of the bipolar transistor Qx in the transverse direction can be increased, and the number of collector outputs that can be led out from the same collector region C can be further increased.

Figure 6:
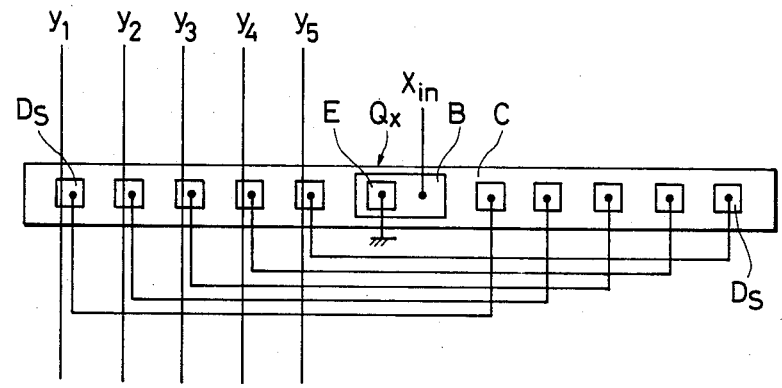
FIG. 6 is a plan view of the layout of still another example of a bipolar transistor of a multi-electrode structure.

FIG. 6 shows another arrangement in which the base and emitter regions B and E are formed at the center of the device-formation region, a large number of wires y1-y10 are arranged on either side of the base and emitter regions, and the collector electrodes close to the outermost end of one of the divided groups of electrodes (y1-y5) are connected to the collector electrodes close to the innermost end of the other of the divided groups of electrodes (y6-y10) to form pairs. This arrangement provides the effect that differences in characteristics arising from the lead-out position of each collector output can be offset against one another.

In FIGS. 5 and 6, the symbol Xin represents the logical input applied to the base B.

Figure 7:
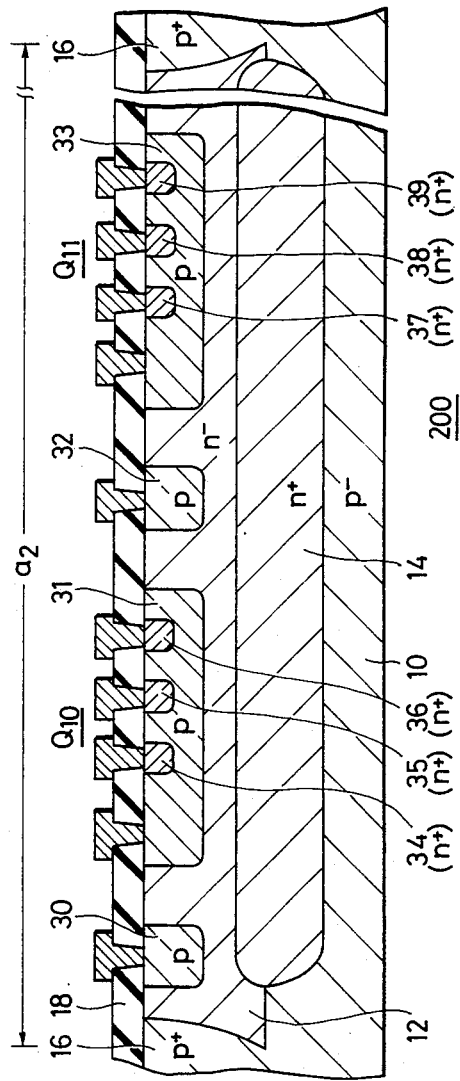
FIG. 7 is a section through one example of a bipolar transistor of the NOR gate array used in the PLA of FIG. 2.

FIG. 7 illustrates a section through the structure of IIL backward bipolar transistors Q10 and Q11 forming the NOR gate array 200 of the PLA of FIG. 2. An $n^+$-type buried layer 14 is formed on a $p^-$-type silicon semiconductor substrate 10, and an $n^-$ silicon epitaxial layer 12 on the substrate 10. A $p^+$-type isolation layer 16 is formed within the epitaxial layer 12 to define a device-formation region a2.

A plurality of p-type regions 30, 31, 32 and 33 are formed in the device-formation region a2, $n^+$-type regions 34, 35 and 36 are formed in the p-type region 31, and $n^+$-type regions 37, 38 and 39 are formed in the p-type region 33.

The p-type region 30, the $n^-$-type epitaxial layer 12, and the p-type region 31 function as the emitter, base, and collector regions, respectively, of a lateral pnp current-source transistor of a constant-current circuit Is.

The $n^+$-type buried layer 14 and the $n^-$-type epitaxial layer 12, the p-type region 31, and the plurality of $n^+$-type regions 34, 35, 36 function as the emitter, base, and multicollector regions, respectively, of a backward npn transistor Q10.

The p-type region 32, the $n^-$-type epitaxial layer 12, and the p-type region 33 function as the emitter, base, and collector regions, respectively, of another lateral pnp current source transistor.

The $n^+$-type buried layer 14 and the $n^-$-type epitaxial layer 12, the p-type region 33, and the plurality of $n^+$-type regions 37, 38, 39 function as the emitter, base, and multicollector regions, respectively, of the backward npn transistor Q11, respectively.

This embodiment of the present invention provides the following advantages.

(1) Since forward transistors are used for the NAND gate array circuit, a constant-current circuit is not necessary, unlike in the case in which IIL devices are used. Accordingly, current flows only when the transistors are turned on, and the current consumed by logic circuits such as the PLA can be reduced.

(2) Since forward transistors are employed, the driving capacity (drivability) of the transistors is high, and a greater number of outputs (the size of the multicollector) can be increased. Accordingly, a logic circuit of a greater size can be constituted with a smaller number of devices.

(3) The ouptut of the NAND gate array circuit are connected directly to the IIL devices constituting the NOR gate array circuit. Therefore, no load resistance, etc., is necessary, and hence interface devices are not needed either. Since no isolation is required for the IIL devices, the device area is small, so that the area of the logic circuit can be reduced.

(4) The embodiment employs an arrangement in which forward transistors are used, a large number of transistors of a multi-collector structure enabling the lead out of a plurality of outputs from the same collector region are provided, and a plurality of wires extend over the collector regions of the transistors. According to this arrangement, logical oututs satisfying predetermined logic conditions can be obtained from a plurality of wires by selecting the contact points between the collector regions and the wires are required. Thus, a structure of a high regularity can be obtained, and the size of a logic circuit such as a PLA can be easily expanded.

(5) A logic circuit with a simple layout but a high operating speed can be formed to a higher density by operating transistors in the forward direction and forming Schottky barrier diodes in series between the collector regions thereof and wires.

(6) A high-density, high-speed semiconductor integrated circuit incorporation a ROM (Read-Only Memory) and IIL devices on the same chip can be obtained because of (1) through (5) above.

Although the present invention has been described with reference to some preferred embodiments thereof, it must be understood that the invention is not particularly limited thereto, but can be worked in various modified forms without departing from the spirit and scope thereof. For instance, the diode Ds may be p-n junction diodes obtained by selectively forming a p-type diffusion layer within the same collector region.

Although the present invention has been primarily described with reference to the technique of fabricating a PLA in the bipolar semiconductor integrated circuit which is the background of the invention, and which is the field of utilization of the invention, the present invention is not particularly limited thereto. For instance, the present invention can also be applied to an integrated circuit formed by arranging a large number of logic elements on a semiconductor chip, such as a microcomputer, a signal processor, or the like.

What is claimed is:

1. A semiconductor integrated circuit comprising a programmable logic array which includes a NAND or an AND gate array to which a plurality of input signals are applied, and a NOR or an OR gate array to which a plurality of output signals from said NAND or AND gate array are applied and which includes means for producing a NOR or and OR output based on said plurality of output signals, wherein said NAND or AND gate array includes a plurality of forward bipolar transistors which are driven to operate in the forward direction by a plurality of said input signals to produce said plurality of output signals, wherein said NOR or OR gate array is comprised of an integrated injection logic (IIL) device.

2. The semiconductor integrated circuit as defined in claim 1, wherein said NAND or AND gate array includes a plurality of diodes connected between collectors of a plurality of said bipolar transistors and a plurality of output signal lines of said NAND or AND gate array.

3. The semiconductor integrated circuit as defined in claim 2, wherein said plurality of said diodes comprises a plurality of Schottky barrier diodes.

4. The semiconductor integrated circuit as defined in claim 1, wherein said NOR or OR gate array of said integrated logic (I1L) device includes a plurality of backward bipolar transistors which are driven to operate in the backward direction by said plurality of output signals from said NAND or AND gate array.

5. A programmable logic circuit comprising:
a first gate array for performing AND or NAND operation, said first gate array comprising a plurality of forward bipolar transistors which are driven in the forward direction by a plurality of input signals coupled to said plurality of forward transistors to produce a plurality of output signals; and
means coupled to said output signals produced by said plurality of forward bipolar transistors to select one of a plurality of output lines of said first gate array.
wherein said first plurlaity of outputs lines of said first gate array coupled said first gate array to a second gate array which includes means for performing an OR or NOR operation on output signal of said first gate array which are coupled to said output lines of said first gate array to produce a NOR or an OR ouptut based on said output signals, wherein said second gate array comprises an integrated injection logic array comprised of a plurality of individual integrated injection logic circuits, with each said individual integrated injection logic circuit including a backward bipolar transitor having an output line of said first gate array coupled to a base thereof and a constant-current source coupled to a base of the backward bipolar transistor and to said ouptut line of said first gate array which is coupled to said base of said backward bipolar transistor, wherein output signals on said output lines of said first gate array drive said backward bipolar transistors in a backward direction to produce an OR or NOR output signal for said second gate array.

6. A programmable logic circuit according to claim 5, wherein said forward bipolar transistors are coupled to receive said input signals at bases thereof and to produce said output signals at collectors thereof.

7. A programmable logic circuit according to claim 6, wherein said coupling means comprises diodes connected for selectively coupling collectors of said forward bipolar transistors to selected ones of said plurality of output lines.

8. A programmable logic circuit according to claim 7, wherein said diode connections are Schottky diode connections.

9. A programmable logic circuit according to claim 5, wherein said coupling means comprises diodes connected for selectively coupling output signals of said forward bipolar transistors to selected ones of said plurality of output lines.

10. A programmable logic circuit according to claim 9, wherein said diode connections are Schottky diode connections.

* * * * *